United States Patent [19]
Chen et al.

[11] Patent Number: 6,136,713
[45] Date of Patent: Oct. 24, 2000

[54] METHOD FOR FORMING A SHALLOW TRENCH ISOLATION STRUCTURE

[75] Inventors: Coming Chen, Taoyuan Hsien; Jenn Tsao; Water Lur, both of Taipei, all of Taiwan

[73] Assignee: United Microelectronics Corp., Hsinchu, Taiwan

[21] Appl. No.: 09/165,608

[22] Filed: Oct. 2, 1998

[30] Foreign Application Priority Data

Jul. 31, 1998 [TW] Taiwan ................................ 87112616

[51] Int. Cl.[7] .............................................. H01L 21/461
[52] U.S. Cl. .......................... 438/692; 438/700; 438/706; 438/712
[58] Field of Search .................................. 438/691, 692, 438/706, 712, 722, 723, 724

[56] References Cited

U.S. PATENT DOCUMENTS

| | | | |
|---|---|---|---|
| 4,180,432 | 12/1979 | Clark | 156/643 |
| 4,726,879 | 2/1988 | Bondur et al. | 156/643 |
| 4,835,115 | 5/1989 | Eklund | 437/38 |
| 5,030,316 | 7/1991 | Motoyama et al. | 156/626 |
| 5,094,972 | 3/1992 | Pierce et al. | 437/67 |
| 5,106,777 | 4/1992 | Rodder | 437/67 |
| 5,118,383 | 6/1992 | Engelhardt | 156/643 |
| 5,290,396 | 3/1994 | Schoenborn et al. | 156/636 |
| 5,316,980 | 5/1994 | Takeshiro | 437/228 |
| 5,395,801 | 3/1995 | Doan et al. | 437/225 |
| 5,441,094 | 8/1995 | Pasch | 156/636.1 |
| 5,492,858 | 2/1996 | Bose et al. | 437/67 |

*Primary Examiner*—Benjamin L. Utech
*Assistant Examiner*—Lan Vinh
*Attorney, Agent, or Firm*—Hickman Coleman & Hughes, LLP

[57] ABSTRACT

A method for forming a shallow trench isolation (STI) structure adds an etching back process to a conventional method which only uses a chemical mechanical process (CMP) process to accomplish the STI structure. In the method of the invention, the CMP process preliminarily planarizes a substrate to remove an insulation layer above the trench and uses the etching back process to accomplish the STI structure.

20 Claims, 3 Drawing Sheets

METHOD FOR FORMING A SHALLOW TRENCH ISOLATION STRUCTURE

CROSS-REFERENCE TO RELATED APPLICATION

This application claims the priority benefit of Taiwan application serial no. 7112616, filed Jul. 31 1998, the full disclosure of which is incorporated herein by reference.

BACKGROUND OF THE INVENTION

1. Field of the Invention

This invention relates to semiconductor fabrication, and more particularly to a method for forming a shallow trench isolation (STI) structure without microscratches so as to reduce a dishing effect during a planarization process.

2. Description of Related Art

The purpose of an isolation structure in an IC device is to prevent carriers, such as electrons or electron holes, from drifting between two adjacent device elements through a semiconductor substrate to cause a current leakage. For example, carriers drift between two adjacent transistors through their substrate. Conventionally, isolation structures are formed between field effect transistors (FETs) in an IC device, such as a dynamic random access memory (DRAM) device, to prevent a current leakage from occurring. The isolation structures usually are formed directly on the semiconductor substrate. For example, a local oxidation (LOCOS) process is a typical isolation process widely used to form a field oxide (FOX) structure for isolating a metal oxide semiconductor (MOS) transistor. LOCOS technology has been well developed so that it can effectively isolate the MOS transistor with a good reliability of performance and low fabrication cost. However, LOCOS technology still has some problems. One example is an occurrence of a bird's beak on the edge of the FOX structure. The bird's beak reduces the isolation performance when device dimension is reduced. Hence, LOCOS technology is not suitable for a highly integrated device.

Shallow trench isolation (STI) is another widely used technology for isolating device elements. The STI structure is particularly suitable for a highly reduced dimension. The STI process usually uses a silicon nitride layer as a mask to form a trench in the substrate by anisotropic etching. Then the trench is filled with an oxide material serving as an isolating structure which has a top surface as high as the substrate surface.

FIGS. 1A–1C are cross-sectional views of a semiconductor device schematically illustrating a conventional fabrication process for forming a STI structure. In FIG. 1A, a masking layer 102 with desired pattern is formed over a semiconductor substrate 100. A trench 104 is formed in the substrate 100 by etching. In FIG. 1B, an insulating layer 106 including oxide is formed over the substrate 100 so that the trench 104 is filled.

In FIG. 1C, a chemical mechanical polishing (CMP) process is performed to polish the insulating layer 106 until the masking layer 102 is exposed, in which the remaining portion within the trench 104 lorms a STI structure 106a.

The CMP process is performed by using the masking layer 102 as the polishing stop layer. In order to completely remove the insulating layer on the masking layer, a strategy of over-polishing the masking layer 102 is usually taken. Since the masking layer 102 is usually harder than the insulating layer 106, the insulating layer 106 has a faster polishing rate than that of the masking layer 102. This causes the STI structure 106a to have a concave surface, which is lower than the top surface of the masking layer 102. This phenomenon is also called a dishing phenomenon. If the width of the trench 104 gets wider, the dishing phenomenon becomes more obvious and may cause a dishing problem. Moreover, because the CMP process includes small grinding particles to polish the insulating layer 104, microscratches may occur on the surface of the STI structure 106a. Furthermore, the polished surface of the substrate 100 may not be uniform due to global planarization. All these problems can affect the performance of the semiconductor device.

SUMMARY OF THE INVENTION

It is therefore an objective of the present invention to provide an improved method for forming a shallow trench isolation (STI) structure that avoids dishing, microscratches. and non-uniformity. The method mainly includes performing a chemical mechanical polishing (CMP) process to polish an insulating layer in a fixed period of operation time or to a fixed ending point of operation so that a masking layer is not exposed. An etching back process, such as a reactive ion etching (RIE) process, is further performed to expose the masking layer. The STI structure is thereby formed with an effective avoidance of dishing and microscratches. The uniformity of the substrate surface is maintained. These advantages result in an improvement of the product performance.

In accordance with the foregoing and other objectives of the present invention, an improved method for forming a shallow trench isolation (STI) structure that avoids dishing, microscratches, and non-uniformity is provided. The method includes forming a masking layer over a semiconductor substrate. The masking layer includes, for example, silicon nitride. The masking layer is patterned by, for example, photolithography and etching to form a desired pattern, such as a pattern for forming a trench, so that a portion of the substrate is exposed. Using the patterned masking layer, the substrate is etched to form a trench in the substrate. An insulating layer including, for example, oxide is formed over the substrate. The trench is also filled with the insulating layer. A CMP process is performed to partially polish the insulating layer so that the masking layer is not exposed. This can be achieved by, for example, establishing a fixed period of operation time or a fixed ending point of operation. An etching back process including, for example, a reactive ion etching process is performed to expose the masking layer so that the insulating layer filled in the trench is also planarized to form the STI structure. Dishing and microscratches are effectively avoided in the STI structure of the invention. The uniformity of the substrate surface is also maintained.

BRIEF DESCRIPTION OF DRAWINGS

The invention can be more fully understood by reading the following detailed description of the preferred embodiment with reference made to the accompanying drawings as follows.

DETAILED DESCRIPTION OF PREFERRED EMBODIMENT

In a conventional method for fabricating a STI structure, in order to globally planarize the substrate top surface after an insulating layer is formed; a CMP process is usually performed to remove the portion of the insulating layer other than what is in the trench. The remaining insulating layer within the trench forms the STI structure. The masking layer under the insulating layer serves as a polishing stop layer of the CMP process. In order to completely remove the insulating layer, a strategy of over polishing the masking layer is applied. Since the masking layer is harder than the insulating layer, the polishing rate of the insulating layer is greater than that of the masking layer. During the over etching stage on the masking layer, the insulating layer within the trench is etched faster than the masking layer. A dishing problem within the trench therefore occurs. Moreover the grinding particles involved in the CMP process may scratch the STI structure, resulting in microscratches. Furthermore, the substrate surface may lose its uniformity due to global planarization of the CMP process.

The method of the invention uses a CMP process and an etching back process together to form a STI structure, which is well planarized. The dishing and microscratch problems are effectively avoided. The substrate also does not lose its uniformity.

Figure 1A:
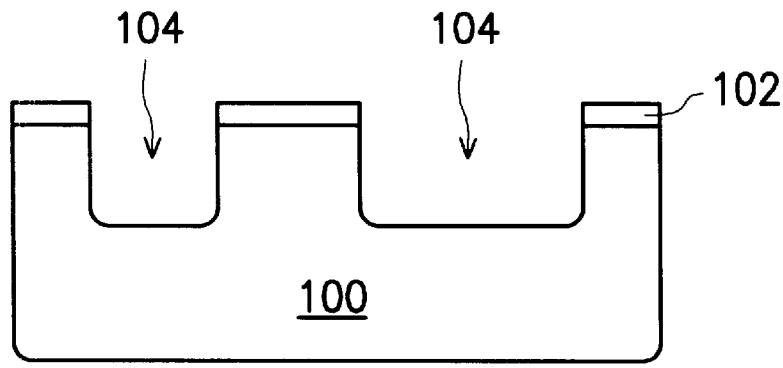
FIGS. 1A–1C are cross-sectional views of a semiconductor device schematically illustrating a conventional fabrication process for forming a STI structure.
Figure 1B:
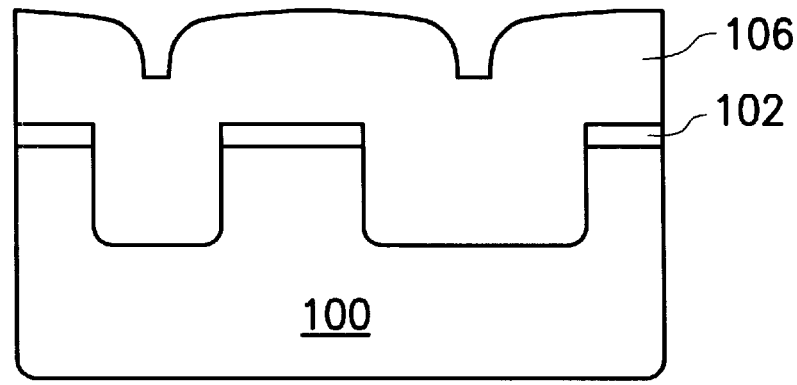
Figure 1C:
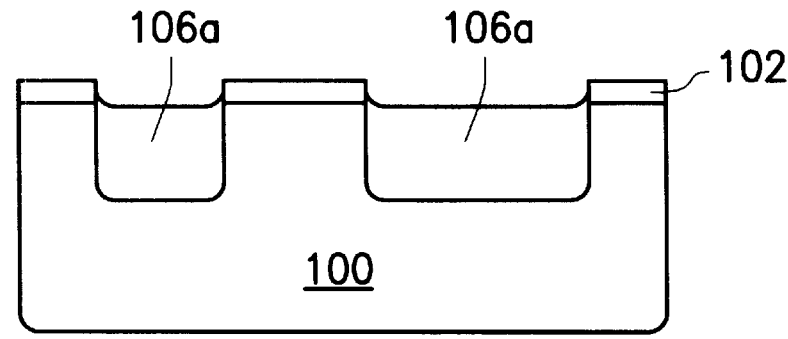
Figure 2A:
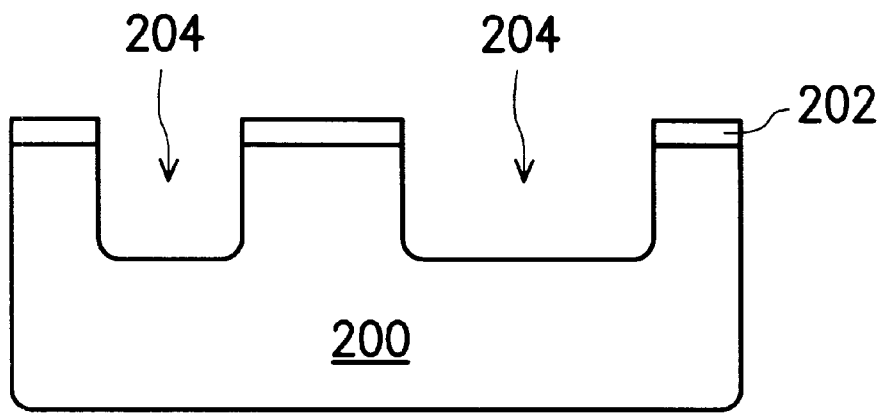
FIGS. 2A–2D are cross-sectional views of a semiconductor device schematically illustrating a fabrication process for forming an improved STI structure, according to a preferred embodiment of the invention.

FIGS. 2A–2D, are cross-sectional views of a semiconductor device schematically illustrating a fabrication process for forming an improved STI structure, according to a embodiment of the invention. In FIG. 2A, a masking layer 202 including, for example, silicon nitride is formed over a semiconductor substrate 200. The masking layer 202 is patterned by, for example, photolithography and etching to form a desired pattern so as to expose a portion of the substrate 200. The portion covered by masking layer 202 is usually called an active area. The exposed portion of the substrate 200 is for a purpose of forming an isolation structure. Next, an etching process is performed to etch the substrate 200 so as to form a trench 204 in the substrate 200 with a desired depth, which is usually shallow.

Figure 2B:
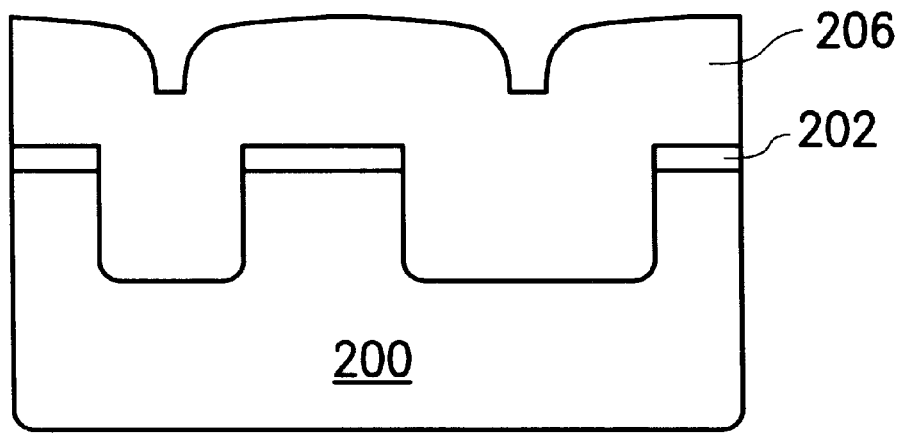

In FIG. 2B, an insulating layer 206 including, for example, oxide or other similar materials is formed over the substrate 200. The trench 204 of FIG. 2A is filled. The insulating layer 206 is conventionally softer than the masking layer 202.

Figure 2C:
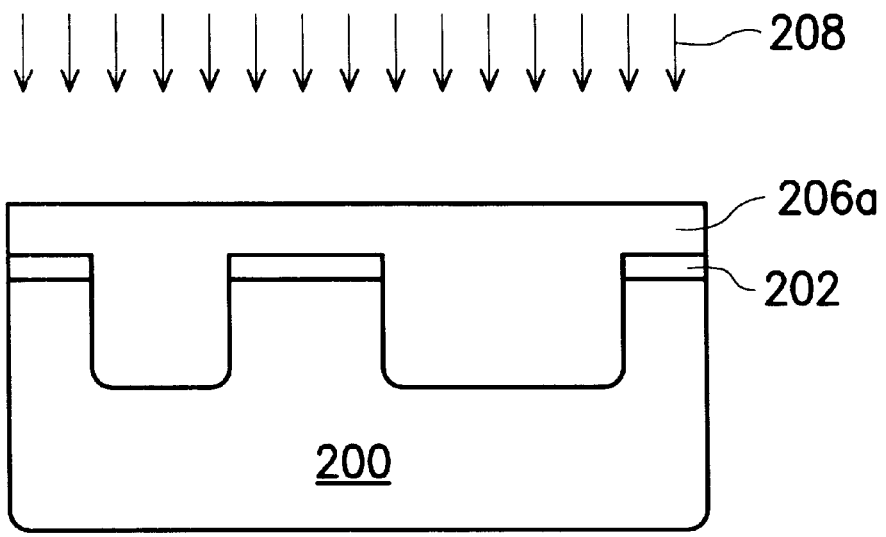

In FIG. 2C, in order to planarize over the substrate 200 and form a STI structure in the trench 204 shown in FIG. 2A, a planarization process is performed. The planarization process preferably includes a CMP process for preliminary planarization to polish a portion of the insulating layer 206, which becomes an insulating layer 206a. At this stage, the masking layer is not yet exposed. In this manner, the CMP process is operated, for example, in a fixed period of time or by setting a fix polishing ending point.

Figure 2D:
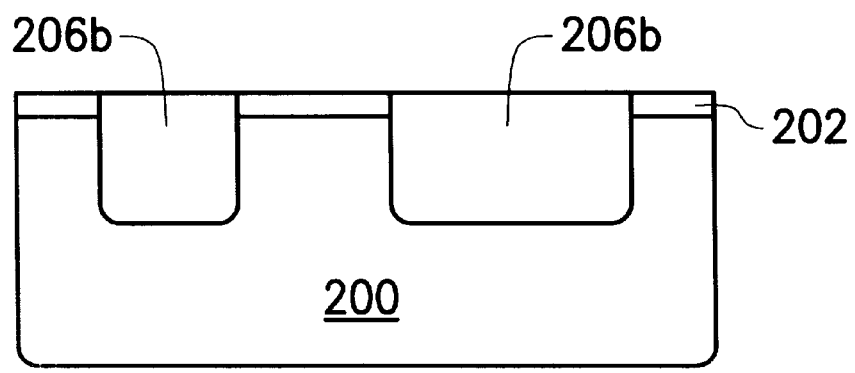

An etching back process 208, using the masking layer 202 as an etching stop, is further performed to etch the insulating layer 206a so as to expose the mask layer 202, as shown in FIG. 2D. The remaining insulating layer 206b within the trench 204 is planarized and forms the STI structure. The etching back process preferably includes a dry etching process, such as reactive ion etching (RIE).

Since the etching back process 208 takes the place of the CMP process at the stage where the masking layer 202 is exposed, the dishing and microscratch problems caused by the CMP process in the conventional fabrication process are naturally avoided. Since the etching back process uses the masking layer as the etching stop, the uniformity of the substrate is well maintained.

In conclusion, the invention uses the CMP process to preliminarily planarize the insulating layer 206 to make use of the advantages of CMP technologies, which can effectively and globally planarize the substrate 200. Then, the invention uses an etching back process to expose the masking layer 202 and form the STI structure 206b so that the disadvantages of the CMP process are naturally avoided.

The method of the invention is also suitable for any similar situation in fabrication process, for example when a trench or an opening are to be filled with a material that is softer than a material for a masking layer serving as a stop layer for etching back or polishing. If the material used to fill the opening is not softer, the dishing problem may not be induced by the CMP process but microscratches and poor uniformity may still occur. In this situation, the method of the invention is still suitable for avoiding microscratches and poor uniformity.

Moreover, the method is also suitable for forming a contact plug or a via plug, in which the plug structures are similar to the STI structure because all of them are formed by filling an opening. The difference is that the plugs are made of conductive material while the STI is made of insulating material.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for forming a shallow trench isolation (STI) structure, the method comprising:
    forming a masking layer over a semiconductor substrate, wherein the masking layer is patterned to expose a portion of the substrate;
    forming a trench in the substrate at the exposed region;
    forming an insulating layer over the substrate, wherein the trench is at least filled;
    performing a chemical mechanical polishing (CMP) process to preliminarily polish the insulating layer so that the masking layer remains unexposed; and
    etching the insulating layer which is above the level of the upper surface of the masking layer so that the masking layer is exposed, wherein the remaining insulating layer within the trench forms the STI structure.

2. The method of claim 1, wherein the masking layer comprises silicon nitride.

3. The method of claim 1, wherein the insulating layer comprises oxide.

4. The method of claim 1, wherein the step of performing the CMP process comprises a condition of a fixed period of performing time.

5. The method of claim 1, wherein the step of performing the CMP process comprises a condition of setting a fixed polishing ending point.

6. The method of claim 1, wherein the step of etching the insulating layer comprises an etching back process.

7. The method of claim 6, wherein the etching back process comprises a dry etching process.

8. The method of claim 7, wherein the dry etching process comprises a reactive ion etching (RIE).

9. A method for forming a shallow trench isolation (STI) structure, the method comprising:
    forming a masking layer over a semiconductor substrate, wherein the masking layer is patterned to expose a plurality of isolation regions;

forming a plurality of trenches in the substrate at the isolation regions;

forming an insulating layer over the substrate;

performing a chemical mechanical polishing (CMP) process to preliminarily polish the insulating layer so that the masking layer remains unexposed; and etching the insulating layer, which is above the level of the upper surface of the masking layer so that the masking layer is exposed, wherein the remaining insulating layer within the trenches forms the STI structure.

10. The method of claim 9, wherein the masking layer comprises silicon nitride.

11. The method of claim 9, wherein the insulating layer comprises oxide.

12. The method of claim 9, wherein the step of performing the CMP process comprises a condition of a fixed period of performing time.

13. The method of claim 9, wherein the step of performing the CMP process comprises a condition of setting a fixed polishing ending point.

14. The method of claim 9, wherein the step of etching the insulating layer comprises an etching back process.

15. The method of claim 14, wherein the etching back process comprises a dry etching process.

16. The method of claim 15 wherein the dry etching process comprises a reactive ion etching (RIE).

17. A method for filling an opening with material, in which the opening is formed in a semiconductor substrate having a first layer on it, the method comprising:

forming a dielectric layer over the substrate, wherein the opening is at least filled and a region abutting the opening is also covered;

performing a chemical mechanical polishing (CMP) process to preliminarily polish the dielectric layer so that the first layer, which is under the dielectric layer, is not exposed; and performing an etching back process to remove the dielectric layer other than the opening so that the first layer is exposed and the remaining dielectric layer within the opening is simultaneously planarized to have the same height as that of the first layer.

18. The method of claim 17, wherein the first layer comprises silicon nitride.

19. The method of claim 17, wherein the dielectric layer comprises oxide.

20. The method of claim 17, wherein the etching back process comprises a reactive ion etching (RIE) process.

* * * * *